(12) United States Patent
Park et al.

(10) Patent No.: US 12,230,312 B2
(45) Date of Patent: Feb. 18, 2025

(54) MEMORY DEVICE AND DEFENSE METHOD THEREOF

(71) Applicant: Samsung Electronics Co., Ltd., Suwon-si (KR)

(72) Inventors: Changhwi Park, Suwon-si (KR); Junyoung Ko, Suwon-si (KR); Jungmin Bak, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 157 days.

(21) Appl. No.: 18/191,039

(22) Filed: Mar. 28, 2023

(65) Prior Publication Data

US 2023/0410875 A1 Dec. 21, 2023

(30) Foreign Application Priority Data

Jun. 17, 2022 (KR) .................. 10-2022-0074180
Sep. 13, 2022 (KR) .................. 10-2022-0114831

(51) Int. Cl.
*G11C 11/40* (2006.01)
*G11C 11/406* (2006.01)
*G11C 11/4078* (2006.01)

(52) U.S. Cl.
CPC .. *G11C 11/40622* (2013.01); *G11C 11/40615* (2013.01); *G11C 11/4078* (2013.01)

(58) Field of Classification Search
CPC ........ G11C 11/40622; G11C 11/40615; G11C 11/4078; G11C 13/0059
See application file for complete search history.

(56) References Cited

U.S. PATENT DOCUMENTS

| 9,564,201 | B2 | 2/2017 | Halbert et al. |
| 9,589,606 | B2 | 3/2017 | Lin et al. |
| 10,262,717 | B2 | 4/2019 | Fisch et al. |
| 11,468,936 | B2 | 10/2022 | Lim |
| 2015/0155025 | A1 | 6/2015 | Lee et al. |
| 2024/0096391 | A1* | 3/2024 | Cho ................. G11C 11/40622 |
| 2024/0104209 | A1* | 3/2024 | Hwang ................. G06F 21/566 |

FOREIGN PATENT DOCUMENTS

| KR | 20150064953 A | 6/2015 |
| KR | 20210158582 A | 12/2021 |

* cited by examiner

*Primary Examiner* — Han Yang
(74) *Attorney, Agent, or Firm* — Myers Bigel, P.A.

(57) ABSTRACT

A defense method of a memory device according to an embodiment includes obtaining a plurality of defense types to refresh a row of a memory cell array that is subjected to an attack, determining respective operation times for the defense types, and performing a refresh operation for the row of the memory cell array by switching among the defense types based on the respective operation times that were determined.

20 Claims, 10 Drawing Sheets

| Wordline | Access Count |
|---|---|
| 462 | 500 |
| 3 | 448 |
| 9 | 411 |
| 50 | 357 |
| 1032 | 271 |
| ... | ... |

MEMORY DEVICE AND DEFENSE METHOD THEREOF

CROSS-REFERENCE TO RELATED APPLICATION

This application claims priority to and the benefit of Korean Patent Application No. 10-2022-0074180 filed in the Korean Intellectual Property Office on Jun. 17, 2022, and Korean Patent Application No. 10-2022-0114831 filed in the Korean Intellectual Property Office on Sep. 13, 2022, the entire contents of which are incorporated herein by reference.

FIELD

The present disclosure relates to a memory device and a defense method thereof.

BACKGROUND

A volatile memory device such as a dynamic random access memory (DRAM) can require a refresh operation to maintain stored data. A row-hammering (RH) attack is a security attack method that may use a physical vulnerability caused by the refresh operation of the DRAM. An attacker may use the RH attack to gain an administrator's privilege or cause a system to go down.

An example of a defense technique that may be used to defend against the RH attack is a target row refresh (TRR). The TRR is a method in which an address of an attacked word line and the number of the attack are recorded and the most vulnerable address is refreshed based on the recorded information. However, as a round-robin attack method that attacks the address by avoiding a defense logic of the TRR has emerged, a design of the TRR may have multiple goals, including for example, increasing robustness against the RH attack and reducing overhead (which may be difficult to achieve at the same time), and may need to consider cost-effectiveness.

SUMMARY

Some embodiments provide a memory device with increased robustness against a row-hammering (RH) attack.

Some embodiments provide a memory device that increases defense performance without increasing overhead by adding a minimum defense circuit.

A defense method of a memory device according to an embodiment for solving the above-stated technical problem may include executing, by a processor, computer readable program instructions embodied in a non-transitory storage medium to perform operations comprising: obtaining a plurality of defense types to refresh a row of a memory cell array of the memory device that is subjected to an attack; determining respective operation times for the defense types; and performing a refresh operation for the row of the memory cell array by switching among the defense types based on the respective operation times that were determined.

Another defense method of a memory device according to an embodiment may include executing, by a processor, computer readable program instructions embodied in a non-transitory storage medium to perform operations comprising: performing a refresh operation for one or more memory cells of the memory device using a first defense type that is configured to defend against a first attack command sequence; and performing the refresh operation using a second defense type that is configured to defend against a second attack command sequence that is different than the first attack command sequence.

A memory device according to an embodiment may include: a memory cell array; and a defense circuit coupled to the memory cell array, wherein the defense circuit is configured to obtain a plurality of defense types, determine respective operation times for the defense types, and perform a refresh operation for the memory cell array by switching among the defense types based on the respective operation times that were determined.

BRIEF DESCRIPTION OF THE DRAWINGS

FIG. 3 shows a word line table managed by a defense circuit according to an embodiment.

DETAILED DESCRIPTION OF EMBODIMENTS

Figure 1:
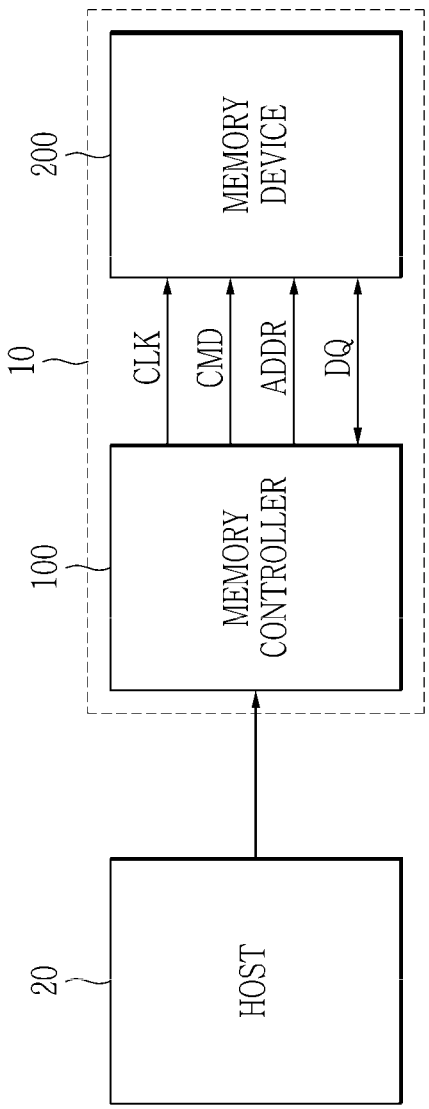
FIG. 1 is a schematic block diagram of a memory system according to an embodiment.

The present invention will be described more fully hereinafter with reference to the accompanying drawings, in which embodiments of the invention are shown. As would be understood by those skilled in the art, the described embodiments may be modified in various different ways, all without departing from the spirit or scope of the present invention.

Accordingly, the drawings and description are to be regarded as illustrative in nature and not restrictive. Like reference numerals designate like elements throughout the specification. In the flowcharts described with reference to the drawings, the order of operations may be changed, several operations may be merged, some operations may be divided, and specific operations may not be performed.

In the present specification, expressions described in the singular may be construed in the singular or plural unless an explicit expression such as "one" or "single" is used. In the present specification, the terms including ordinal numbers such as "first," "second," etc. may be used to describe various elements, but the elements are not limited by the terms. The terms are used only for the purpose of distinguishing one element from another element. Computer readable program instructions may be embodied in a memory or other non-transitory storage medium as described herein and may be executed by a processor to perform one or more functions or operations described herein.

FIG. 1 is a schematic block diagram of a memory system according to an embodiment of the present invention.

Referring to FIG. 1, the memory system 10 may include a memory controller 100 and a memory device 200.

The memory controller 100 may control an overall operation of the memory system 10. The memory controller 100 may write data DQ to or read data DQ from the memory device 200 using signals including a clock signal CLK, a command CMD, and an address ADDR. For example, the memory controller 100 and the memory device 200 may be connected using an individual pin and an individual transmission line to exchange the clock signal CLK, the command CMD, the address ADDR, or the data DQ.

The memory controller 100 may control the memory device 200 in response to a command of a host 20. The host 20 may communicate with the memory controller 100 using an interface protocol such as peripheral component interconnect express (PCIe), advanced technology attachment (ATA), serial ATA (SATA), parallel ATA (PATA), or serial attached SCSI (SAS). The interface protocol between the host 20 and the memory controller 100 is not limited to the above-described examples, and may be other interface protocols such as a universal serial bus (USB), a multi-media card (MMC), an enhanced small disk interface (ESDI), and integrated drive electronics (IDE).

The memory device 200 may be a dynamic random access memory (DRAM) such as a double data rate synchronous dynamic random access memory (DDR SDRAM), a low power double data rate (LPDDR) SDRAM, a graphics double data rate (GDDR) SRAM, a low power DDR (LPDDR), a rambus dynamic random access memory (RDRAM), or the like.

The memory device 200 may include a defense circuit for preventing an attack through the command CMD. The defense circuit may operate in accordance with or using a different defense type for each time interval. The defense type may refer to a type of a defense method used to refresh a row of a memory cell array to be victimized by or otherwise subjected to the attack. For example, when the number of the defense type is S (here, S is an integer greater than 1), the number of combinations of the defense types that the defense circuit can combine may be (S−1)!.

For example, the defense circuit may operate as or according to a first defense type for preventing a first attack or attack type, and may operate as or according to a second defense type for preventing a second attack or attack type. The first attack may last for a first time length, the second attack may last for a second time length, and the first time length may be shorter than the second time length. The defense circuit may operate as or according to the first defense type in or during a first time interval, and may operate as or according to the second defense type in or during a second time interval. While described herein with reference to row-based attacks by way of example, it will be understood that switching among defense types in accordance with embodiments of the present invention are not so limited, and may be similarly applied to other attack types.

In an embodiment, the defense circuit may switch the defense type being used at a predetermined period. That is, in the above-described example, a length of the first time interval and a length of the second time interval may be the same. The defense circuit may determine a change period of each defense type (and thus, the respective times of switching among different defense types) based on a time length of the attack for which each defense type is designed or configured to prevent. The defense circuit may determine the change period of the defense type to be shorter than the first time length of the first attack/type. The change period of the defense type may be an integer multiple of a refresh period (or a refresh cycle). The refresh period may refer to a period of a target row refresh (TRR). Alternatively, the change period of the defense type may be an integer multiple of a clock signal period.

In an embodiment, the defense circuit may allocate a different operation time for each defense type. That is, in the above-described example, a length of the first time interval for the first defense type and a length of the second time interval for the second defense type may be different. The defense circuit may determine an operation time of the defense type in proportion to the time length of the attack for which each defense type is designed or configured to prevent (also referred to herein as "corresponding" attack and defense types). In addition, the defense circuit may determine the operation time of the defense type so that a length of the first time interval and a length of the second time interval do not respectively exceed the first time length. The operation time of the defense type may be an integer multiple of the refresh period. Alternatively, the operation time of the defense type may be an integer multiple of the clock signal period.

The defense circuit may switch the defense type by changing a parameter. The parameter may be a parameter related to refresh (a refresh operation or a refresh method) in the operation or functioning of a volatile memory device. The parameter may include whether an address counter is reset in an eviction step or operation, a logic that determines an address to be evicted in the eviction step, a ratio of a general refresh and the target row refresh (TRR), whether a buffer is added to a table of the target row refresh (TRR), whether a pseudo random number is used, or the like.

The eviction step may refer to a step of resetting at least one of an address value and a counter value in the table of the target row refresh (TRR). The general refresh may refer to refresh (or a refresh operation) for retention in the memory device 200. The buffer of the table of the target row refresh (TRR) may set a partial region of the table as a buffer, and the buffer may store at least one of an address value and a counter value that are evicted. The defense circuit may reset data stored in the buffer according to the defense type. In addition, when the pseudo random number is used, the defense circuit may generate the table of the target row refresh (TRR) with randomness.

The defense circuit may determine the defense type using at least one parameter. For example, there may be a first parameter, a second parameter, and a third parameter that determine the defense type. The defense circuit may determine the defense type using at least one of the first parameter, the second parameter, and the third parameter.

That is, since the memory device 200 operates in a plurality of defense types, it is possible to increase robustness against the attack, to increase defense performance without increasing overhead by adding a minimum defense circuit.

Figure 2:
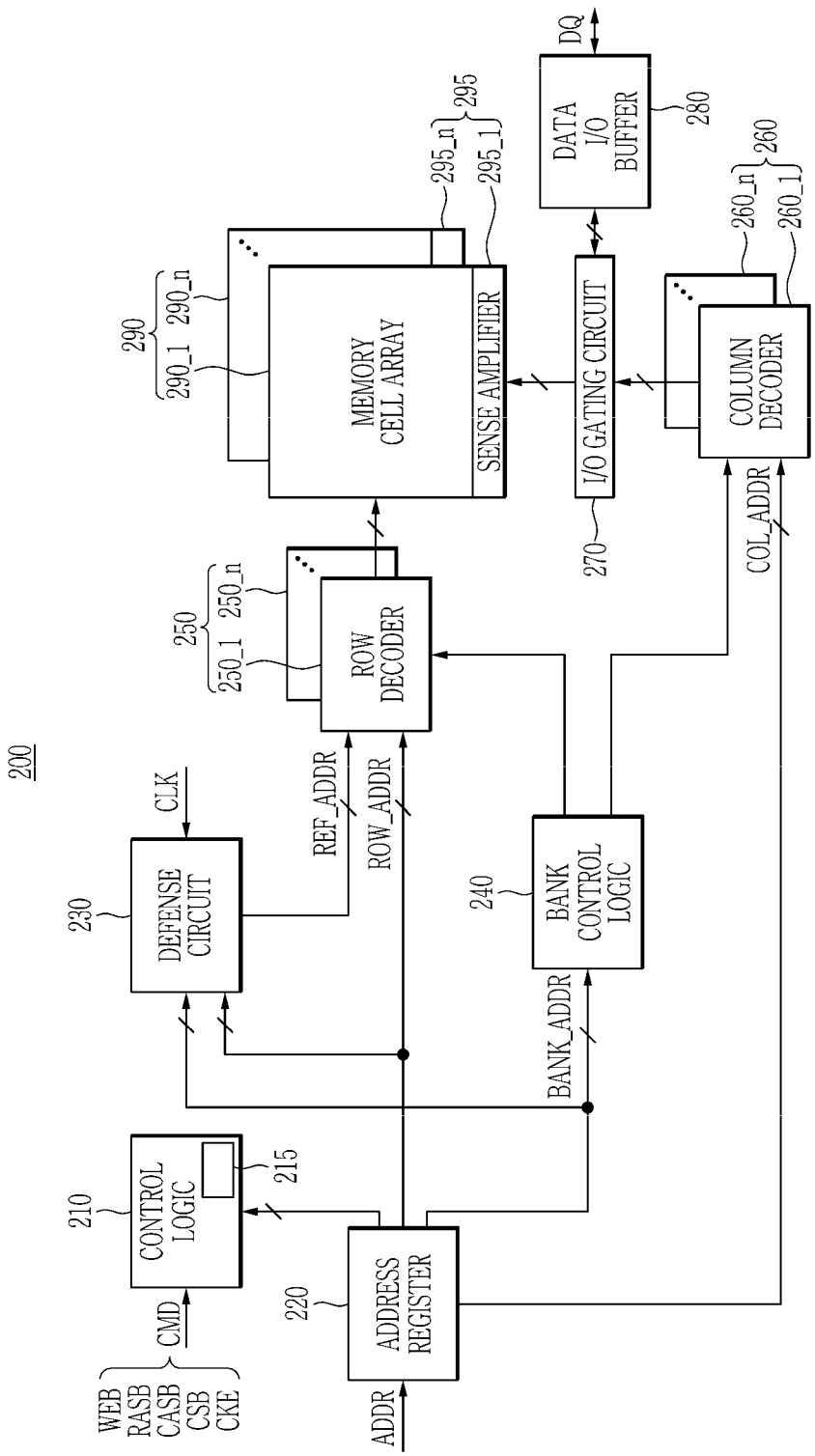
FIG. 2 is a schematic block diagram of a memory device of FIG. 1 according to an embodiment.

FIG. 2 is a schematic block diagram of the memory device of FIG. 1 according to an embodiment. FIG. 3 shows a word line table managed by the defense circuit according to an embodiment.

Referring to FIG. 2, the memory device 200 may include a control logic 210, an address register 220, a defense circuit 230, a bank control logic 240, a plurality of row decoders 250, a plurality of column decoders 260, an input/output gating circuit 270, a data input/output buffer 280, a plurality of memory cell arrays 290, and a plurality of sense amplifiers 295.

The control logic 210 may control an operation of the memory device 200. For example, the control logic 210 may generate an internal signal so that a write operation, an erase operation, a read operation, a refresh operation, or the like is performed in the memory device 200.

The control logic 210 may include a command decoder 215. The command decoder 215 may decode the command CMD received from the memory controller 100 and may generate an internal signal so that the memory device 200 operates according to the command CMD. The command CMD may include a write enable signal WEB, a row address strobe signal RASB, a column address strobe signal CASB, a chip selection signal CSB, a clock enable signal CKE, or the like. The internal signal may include an active signal, a precharge signal, a refresh signal, a write signal, an erase signal, a read signal, or the like.

The address register 220 may receive the address ADDR from the memory controller 100. The address ADDR may include a bank address BANK_ADDR, a row address ROW_ADDR, and a column address COL_ADDR. The address register 220 may provide the row address ROW_ADDR to the defense circuit 230 and the row decoders 250, may provide the bank address BANK_ADDR to the defense circuit 230 and the bank control logic 240, and may provide the column address COL_ADDR to the column decoders 260.

FIG. 2 shows that the control logic 210 and the address register 220 are separate components, but the present invention is not limited thereto. The control logic 210 and the address register 220 may be implemented as one inseparable or single component.

The defense circuit 230 may store and manage a word line frequently accessed in a memory cell array 290 in a table 1000. For example, the defense circuit 230 may store in the table 1000 a word line to which an access count (or the number of accesses) is equal to or greater than a threshold value. The defense circuit 230 may manage the table 1000 for each bank. The defense circuit 230 may generate the table 1000 based on at least one of the bank address BANK_ADDR and the row address ROW_ADDR.

The memory controller 100 may randomly access an address of the memory device 200 according to the command from the host 20, and may often intensively access a specific address. When the specific word line is intensively accessed, data stored in a memory cell of an adjacent word line may be changed due to a voltage in an activated state of the specific word line. The table 1000 may include a word line having the largest access count, and may include an access count of or for the word line. The table 1000 may manage word lines in descending order of the access count.

Referring to FIG. 3, the table 1000 manages word lines frequently accessed in a first memory cell array 290_1 and the access count of the word lines. In the first memory cell array 290_1, a 462nd word line may be accessed 500 times, a 3rd word line may be accessed 448 times, a 9th word line may be accessed 411 times, a 50th word line may be accessed 357 times, and a 1032nd word line may be accessed 271 times.

The defense circuit 230 may generate a refresh address REF_ADDR based on the table 1000 according to a refresh policy defined in the defense type. For example, the defense circuit 230 may output an adjacent word line of a word line managed in table 1000 as the refresh address REF_ADDR. X word lines positioned above the word line and/or y word lines positioned below the word line may be referred to as the adjacent word line of the word line. Here, x and y are integers greater than or equal to 1, and according to an embodiment, x and y may be the same as or different from each other.

When the defense circuit 230 outputs the refresh address REF_ADDR to the row decoders 250, the memory device 200 may perform refresh (e.g., a refresh operation) based on the refresh address REF_ADDR. When the memory device 200 performs refresh, the defense circuit 230 may reset the access count of a word line (e.g., the 462nd word line in FIG. 3) that is a reference of the refreshed word line. The defense circuit 230 may remove from the table 1000 a word line whose access count is reset by being refreshed.

The defense circuit 230 may operate in accordance with or using a different defense type for each time interval. For example, when the number of the defense type is S (here, S is an integer greater than 1), the number of combinations of the defense types that the defense circuit can combine may be (S−1)!. Each different defense type may be or may include a logic (e.g., a respective a logic circuit) designed or configured to prevent a different attack. For example, the first defense type may be a logic for preventing the first attack, and the second defense type may be a logic for preventing the second attack that is different from the first attack.

The defense circuit 230 may determine the defense type using at least one of a plurality of parameters. For example, the parameters may include whether the address counter is reset in the eviction step, a logic that determines an address to be evicted in the eviction step, a ratio of the general refresh and the target row refresh (TRR), whether the buffer is added to the table of the target row refresh (TRR), whether the pseudo random number is used, or the like.

The defense circuit 230 may switch the defense type by changing the parameter. That is, the defense circuit 230 may be configured to operate according to various defense types (e.g., using a respective logic circuit) responsive to a change in the parameter. The defense circuit 230 may use a different defense type for each time interval using the clock signal CLK.

In an embodiment, the defense circuit 230 may determine the change period of the defense type and may switch the defense type based on the change period of the defense type. The defense circuit 230 may determine the change period of the defense type so as to not exceed the shortest duration of attacks. The change period of the defense type may be an integer multiple of the refresh period of the memory device 200. Alternatively, the change period of the defense type may be an integer multiple of the clock signal period.

In an embodiment, the defense circuit 230 may allocate a different operation time for each defense type. The defense circuit may determine an operation time of the defense type in proportion to the time length of the attack for which the corresponding defense type is designed or configured to prevent. In this case, the defense circuit may determine the operation time of the defense type so as to not exceed the shortest duration of the corresponding attack(s). The operation time of the defense type may be an integer multiple of the refresh period of the memory device 200. Alternatively, the operation time of the defense type may be an integer multiple of the clock signal period.

The bank control logic 240 may generate a bank control signal in response to the bank address BANK_ADDR, and may output the generated bank control signal to the row decoders 250 and the column decoders 260. The row decoders 250 may include first through nth row decoders 250_1-250_n. Here, n is an integer greater than 1. The column decoders 260 may include first through nth column decoders 260_1-260_n. Here, n is an integer greater than 1. In response to the bank control signal, a row decoder that corresponds to the bank address BANK_ADDR and that is included in the first through nth row decoders 250_1-250_n may be activated and a column decoder that corresponds to the bank address BANK_ADDR and that is included in the first through nth column decoders 260_1-260_n may be activated.

The memory cell arrays 290 may include first through nth memory cell arrays 290_1-290_n. Here, n is an integer greater than 1. That is, the number of the memory cell arrays 290 may be the same as the number of the row decoders 250 or the number of the column decoders 260. For example, n may be 8, 16, 32, or the like.

The first through nth row decoders 250_1-250_n may be respectively connected to the first through nth memory cell arrays 290_1-290_n. The first through nth column decoders 260_1-260_n may be respectively connected to the first through nth memory cell arrays 290_1-290_n. In addition, the sense amplifiers 295 may include first through nth sense amplifiers 295_1-295_n respectively connected to the first through nth memory cell arrays 290_1-290_n. The first through nth row decoders 250_1-250_n, the first through nth column decoders 260_1-260_n, the first through nth sense amplifiers 295_1-295_n, and the first through nth memory cell arrays 290_1-290_n may respectively constitute first through nth banks. Each of the first through nth memory cell arrays 290_1 to 290_n may include a plurality of word lines, a plurality of bit lines, and a plurality of memory cells formed at points where the word lines and the bit lines intersect each other. Each memory cell may have a DRAM cell structure. A word line to which the memory cell is connected may be designated as a row, and a bit line to which the memory cell is connected may be designated as a column.

A row decoder that is activated by the bank control logic 240 and is included in the first to nth row decoders 250_1 to 250_n may select and decode any one of the row address ROW_ADDR output from the address register 220 and the refresh address REF_ADDR output from the defense circuit 230. Each of the first through nth row decoders 250_1-250_n may include a multiplexer (MUX) for selecting one of the row address ROW_ADDR and the refresh address REF_ADDR. The activated row decoder may activate a word line corresponding to the decoded address. For example, the activated row decoder may apply a word line driving voltage to the word line corresponding to the decoded address.

The column decoders 260 may activate the sense amplifier 295 through the input/output gating circuit 270. For example, a column decoder that is activated by the bank control logic 240 and is included in the first through nth column decoders 260_1-260_n may activate, through the input/output gating circuit 270, a sense amplifier that corresponds to the bank address BANK_ADDR and the column address COL_ADDR and that is included in the first through nth sense amplifiers 295_1 to 295_n. The column decoders 260 may include a column address latch that temporarily stores the column address COL_ADDR.

The input/output gating circuit 270 may include a circuit for gating input/output data, an input data mask logic, a read data latch for storing data output from the memory cell array 290, and a write driver for writing data to the memory cell array 290.

Data DQ read from one memory cell array of the first through nth memory cell arrays 290_1-290_n may be detected by a sense amplifier corresponding to the memory cell array, and may be stored in the read data latch. The data DQ stored in the read data latch may be provided to the memory controller 100 through the data input/output buffer 280. Further, data DQ to be written to one of the first through nth memory cell arrays 290_1-290_n may be provided from the memory controller 100 to the data input/output buffer 280. The data DQ provided to the data input/output buffer 280 may be written in one memory cell array through the write driver.

Figure 4:
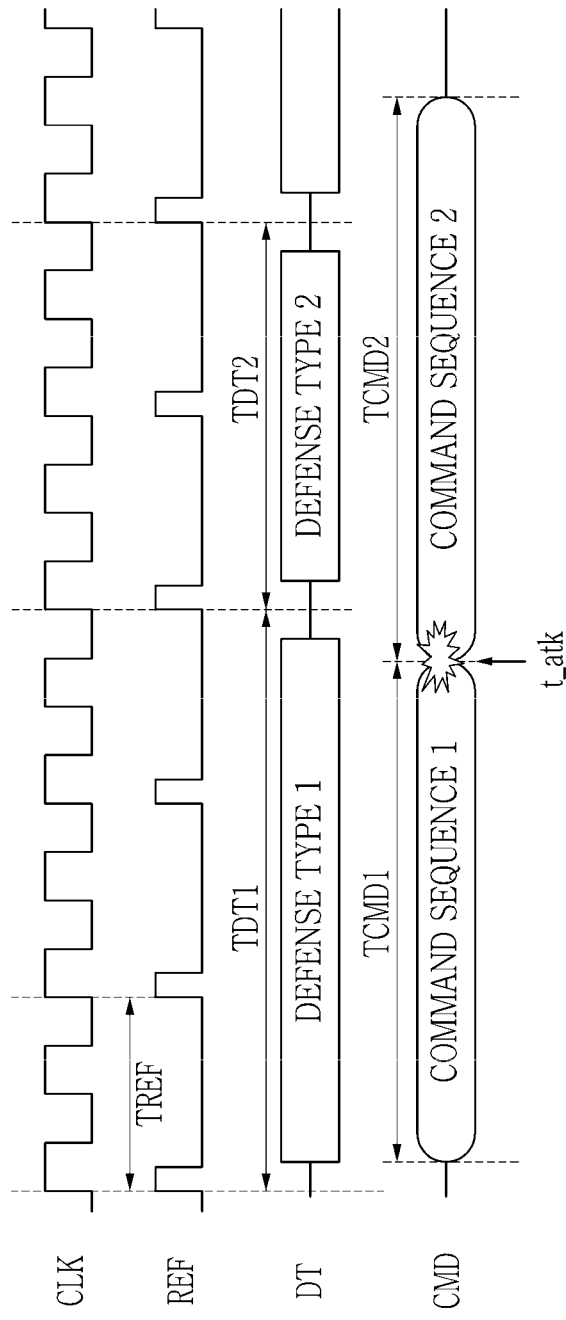
FIG. 4 is a timing diagram for explaining an operation of the memory device according to an embodiment.

FIG. 4 is a timing diagram for explaining an operation of the memory device according to an embodiment.

Referring to FIG. 4, the memory device 200 according to the embodiment may perform refresh in a period TREF. The period TREF may be a period in which the target row refresh (TRR) is performed. The memory device 200 may operate as or according to the first defense type in a time interval TDT1, and may operate as or according to the second defense type in a time interval TDT2. Each of the time interval TDT1 and the time interval TDT2 may be an integer multiple of the period TREF. Alternatively, each of the time interval TDT1 and the time interval TDT2 may be an integer multiple of a period of the clock signal CLK. The time interval TDT1 and the time interval TDT2 may have different time lengths. The memory device 200 may operate as or according to the first defense type using a first parameter set, and may operate as or according to the second defense type using a second parameter set. The first parameter set and the second parameter set may be different.

The defense circuit 230 of the memory device 200 may output the refresh address REF_ADDR according to the first defense type in the time interval TDT1, and may output the refresh address REF_ADDR according to the second defense type in the time interval TDT2.

The memory device 200 may receive a first command sequence and a second command sequence from the memory controller 100 from an arbitrary time point. The first command sequence may last for a time interval TCMD1 and the second command sequence may last for a time interval TCMD2. The first command sequence and the second command sequence may be different types of attack commands received from at least one attacker. The first defense type may be a logic for defending against the second command sequence, and the second defense type may be a logic for defending against the first command sequence. In FIG. 4, TDT1 that is a duration of the first defense type may be longer than TCMD1 that is a duration of the first command sequence.

That is, since the first defense type that operates during the time interval TCMD1 in which the memory device 200 receives the first command sequence does not defend against the first command sequence, the attacker's attack may succeed at a time t_atk. Accordingly, the memory device 200 may change a combination of a plurality of defense types or may change a switching time of the defense types to defend against various attacks, thereby providing improvements in comparison to some conventional technologies (e.g., single defense-type methods) in which the first defense type cannot defend against round-robin or other multi-command sequence-based attacks.

Figure 5:
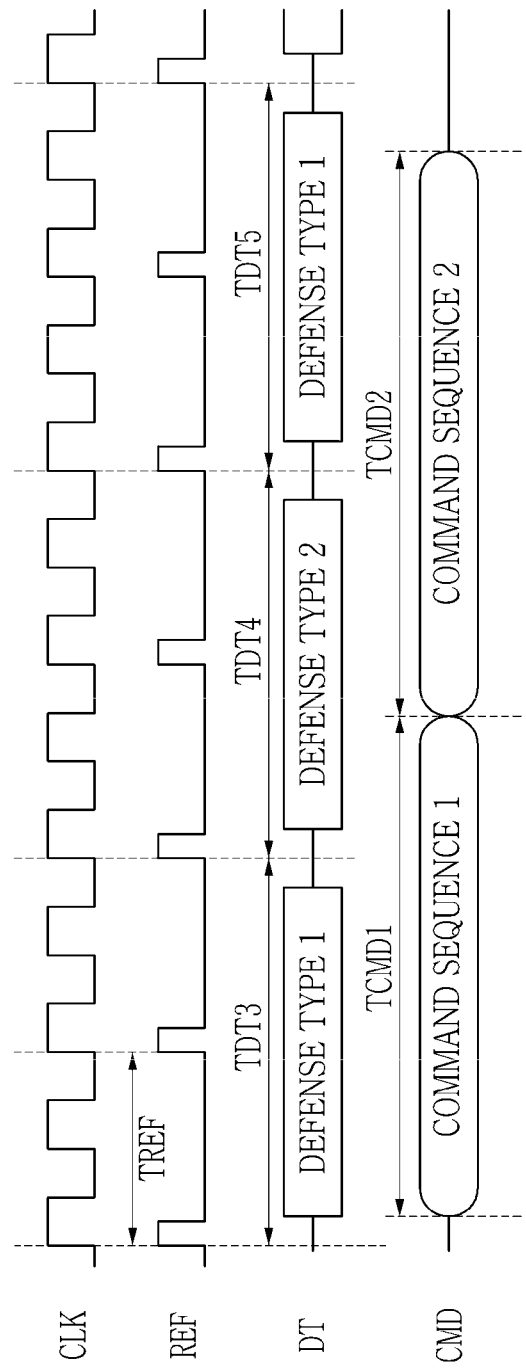
FIG. 5 is a timing diagram for explaining an operation of the memory device according to an embodiment.

FIG. 5 is a timing diagram for explaining an operation of the memory device according to an embodiment.

Referring to FIG. 5, the memory device 200 according to the embodiment may perform refresh in a period TREF. The period TREF may be a period in which the target row refresh (TRR) is performed. The memory device 200 may defend against an attack by combining the first defense type and the second defense type. For example, the memory device 200 may operate as or according to the first defense type during a time interval TDT3 and may operate as or according to the second defense type during a time interval TDT4. Each of the time interval TDT3 and the time interval TDT4 may be an integer multiple of the period TREF. Alternatively, each of the time interval TDT3 and the time interval TDT4 may be an integer multiple of a period of the clock signal CLK. The time interval TDT3 and the time interval TDT4 may have the same time length. The memory device 200 may operate as or according to the first defense type using a first parameter set, and may operate as or according to the second defense type using a second parameter set. The first parameter set and the second parameter set may be different.

The defense circuit 230 of the memory device 200 may output the refresh address REF_ADDR according to the first defense type in the time interval TDT3, and may output the refresh address REF_ADDR according to the second defense type in the time interval TDT4.

The memory device 200 may receive a first command sequence and a second command sequence from the memory controller 100 from an arbitrary time point. The first command sequence may last for a time interval TCMD1 and the second command sequence may last for a time interval TCMD2. The first command sequence and the second command sequence may be different types of attack commands received from at least one attacker. The first defense type may be a logic for defending against the second command sequence, and the second defense type may be a logic for defending against the first command sequence. In FIG. 5, TDT3 that is a duration of the first defense type may be shorter than TCMD1 that is a duration of the first command sequence.

That is, during the time interval TCMD1 in which the memory device 200 receives the first command sequence, the defense circuit 230 may change from the first defense type to the second defense type. The defense circuit 230 may defend against an attack by the first command sequence by performing refresh in or when operating according to the second defense type.

The defense circuit 230 may operate as or according to the first defense type in the time interval TDT3, may operate as or according to the second defense type in the time interval TDT4, and then may operate as or according to the first defense type in a time interval TDT5. The time interval TDT3, the time interval TDT4, and the time interval TDT5 may have the same time length. That is, during the time interval TCMD2 in which the memory device 200 receives the second command sequence, the defense circuit 230 may change from the second defense type to the first defense type. The defense circuit 230 may defend against an attack by the second command sequence by performing refresh in or when operating according to the first defense type. The defense circuit 230 may increase robustness against the attack by switching the defense type.

FIG. 5 describes that the memory device 200 operates in the first defense type and the second defense type, but the present invention is not limited thereto. The present invention may be implemented by combining three or more defense types.

In addition, the memory device 200 is shown as receiving the first command sequence and the second command sequence in the time interval of FIG. 5, but the present invention is not limited thereto. The present invention may be implemented as receiving three or more command sequences, in various orderings.

Figure 6:
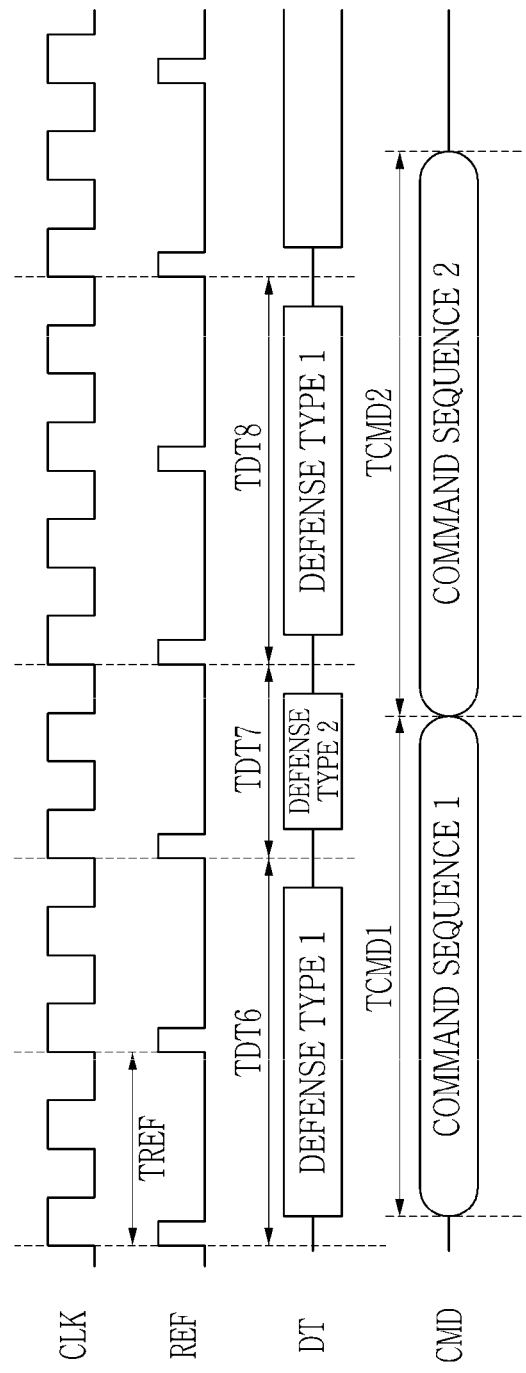
FIG. 6 is a timing diagram for explaining an operation of the memory device according to an embodiment.

FIG. 6 is a timing diagram for explaining an operation of the memory device according to an embodiment.

Referring to FIG. 6, the memory device 200 according to the embodiment may perform refresh in a period TREF. The period TREF may be a period in which the target row refresh (TRR) is performed. The memory device 200 may defend against an attack by combining the first defense type and the second defense type. For example, the memory device 200 may operate as or according to the first defense type during a time interval TDT6 and may operate as or according to the second defense type during a time interval TDT7. Each of the time interval TDT6 and the time interval TDT7 may be an integer multiple of the period TREF. Alternatively, each of the time interval TDT6 and the time interval TDT7 may be an integer multiple of a period of the clock signal CLK. The time interval TDT6 and the time interval TDT7 may have different time lengths. The memory device 200 may operate as or according to the first defense type using a first parameter set and may operate as or according to the second defense type using a second parameter set. The first parameter set and the second parameter set may be different.

The defense circuit 230 of the memory device 200 may output the refresh address REF_ADDR according to the first defense type in the time interval TDT6, and may output the refresh address REF_ADDR according to the second defense type in the time interval TDT7.

The memory device 200 may receive a first command sequence and a second command sequence from the memory controller 100 from an arbitrary time point. The first command sequence may last for a time interval TCMD1 and the second command sequence may last for a time interval TCMD2. The first command sequence and the second command sequence may be different types of attack commands received from at least one attacker. The first defense type may be a logic for defending against the second command sequence, and the second defense type may be a logic for defending against the first command sequence.

The defense circuit or circuitry 230 may determine a duration of each defense type so that the duration of each defense type does not exceed a duration of the command sequence. For example, the defense circuit 230 may determine a duration of the shortest attack command sequence expected to be received. The defense circuit 230 may determine the duration of each defense type within a range that does not exceed the duration of (e.g., a duration that is less than) the shortest expected attack command sequence.

In this case, the defense circuit 230 may determine the duration of the defense type in proportion to a time length of the attack for which each defense type is designed or configured to prevent. For example, when a duration of the first command sequence is shorter than a duration of the second command sequence, the defense circuit 230 may make a duration of the second defense type for defending against the first command sequence shorter than a duration of the first defense type for defending against the second command sequence.

That is, during the time interval TCMD1 in which the memory device 200 receives the first command sequence, the defense circuit 230 may change from the first defense type to the second defense type. The defense circuit 230 may defend against an attack by the first command sequence by performing refresh in or when operating according to the second defense type.

The defense circuit 230 may operate as or according to the first defense type in the time interval TDT6, may operate as or according to the second defense type in the time interval TDT7, and then may operate as or according to the first defense type in a time interval TDT8. The time interval TDT6 and the time interval TDT8 may have the same time length. The time interval TDT6 and the time interval TDT7 may have different time lengths. That is, during the time interval TCMD2 in which the memory device 200 receives the second command sequence, the defense circuit 230 may change from the second defense type to the first defense type. The defense circuit 230 may defend against an attack by the second command sequence by performing refresh in the first defense type. The defense circuit 230 may increase robustness against the attack by switching the defense type.

FIG. 6 describes that the memory device 200 operates in the first defense type and in the second defense type, but the present invention is not limited thereto. The present invention may be implemented by combining three or more defense types.

In addition, the memory device 200 is shown as receiving the first command sequence and the second command sequence in the time interval of FIG. 6, but the present invention is not limited thereto. The present invention may be implemented as receiving three or more command sequences, in various orderings.

Figure 7:
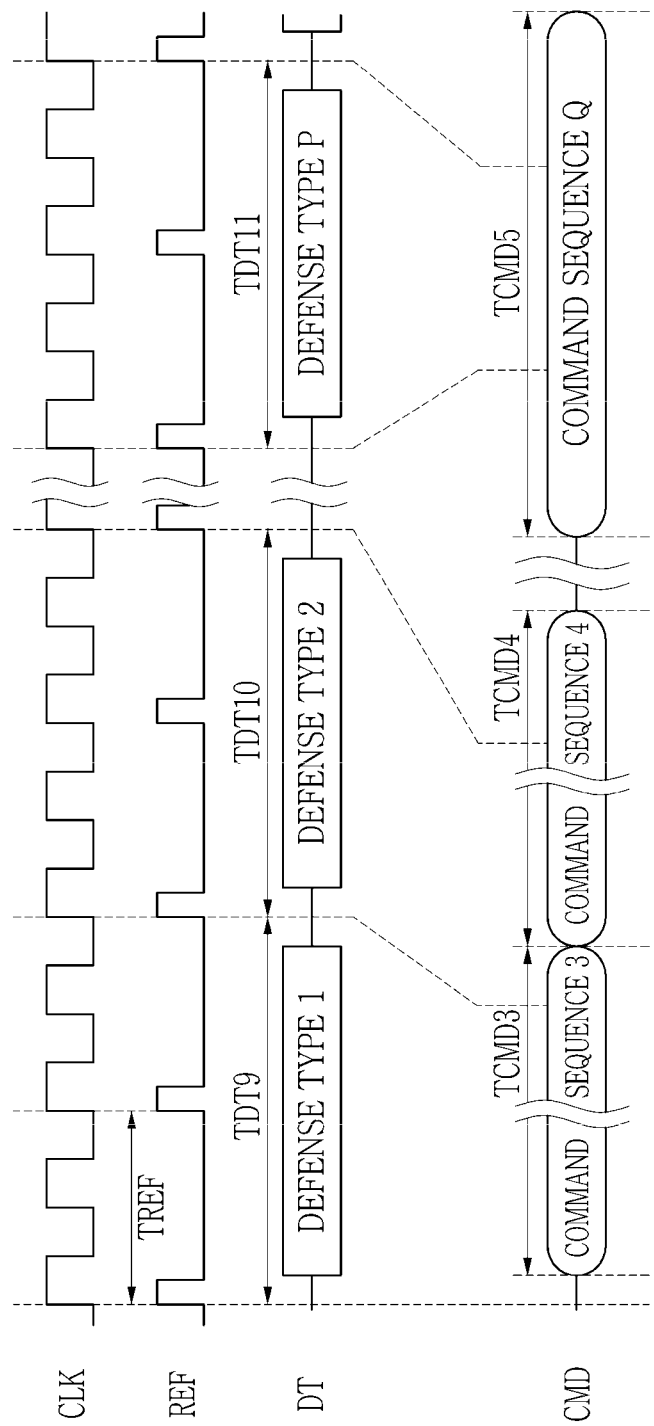
FIG. 7 is a timing diagram for explaining an operation of the memory device according to an embodiment.

FIG. 7 is a timing diagram for explaining an operation of the memory device according to an embodiment.

Referring to FIG. 7, the memory device 200 according to the embodiment may perform refresh in a period TREF. The period TREF may be a period in which the target row refresh (TRR) is performed. The memory device 200 may defend against an attack by combining a plurality of defense types (e.g., first through P-th defense types). Here, P is an integer greater than 2. For example, the memory device 200 may operate as or according to the first defense type during a time interval TDT9, may operate as or according to the second defense type during a time interval TDT10, and may operate as or according to a P-th defense type during a time interval TDT11. Each of the time intervals TDT9 through TDT11 may have the same time length, and may be an integer multiple of the period TREF. Alternatively, each of the time intervals TDT9 through TDT11 may be an integer multiple of the period of the clock signal CLK. The memory device 200 may operate as or according to the first defense type using a first parameter set, may operate as or according to the second defense type using a second parameter set, and may operate as or according to the P-th defense type using a P-th parameter set. All of the first through P-th parameter sets may be different.

The defense circuit 230 of the memory device 200 may output the refresh address REF_ADDR according to the first defense type in the time interval TDT9, may output the refresh address REF_ADDR according to the second defense type in the time interval TDT10, and may output the refresh address REF_ADDR according to the P-th defense type in the time interval TDT11.

In an embodiment, after the time interval TDT11, the defense circuit 230 may operate from the first defense type as operated in the time intervals TDT9 through TDT11.

In an embodiment, after the time interval TDT11, the defense circuit 230 may recombine the defense types to operate differently from operations in the time intervals TDT9 through TDT11.

The memory device 200 may receive a plurality of commands from the memory controller 100 from an arbitrary time point. The plurality of commands may include third through Q-th commands. A third command sequence may last for a time interval TCMD3, a fourth command sequence may last for a time interval TCMD4, and a Q-th command sequence may last for a time interval TCMD5. The third through Q-th command sequences may be different types of attack commands received from at least one attacker. The first defense type may be a logic for defending against the third command sequence, the second defense type may be a logic for defending against the fourth command sequence, and the P-th defense type may be a logic for defending against the Q-th command sequence. In FIG. 7, each of durations TDT9 through TDT11 of the defense types may not exceed each of durations of the command sequences TCMD3 through TCMD5.

That is, the defense circuit 230 may determine a change period of the defense type within a range that does not exceed a duration of the shortest attack command sequence expected to be received. In other words, the defense circuit 230 may determine a duration of each defense type so that the defense type is changed while an attack command sequence is received. The defense circuit 230 may increase robustness against the attack by switching the defense type, which may thereby improve operation of memory devices as described herein by preventing (or reducing the likelihood of success of) more sophisticated security attacks.

Figure 8:
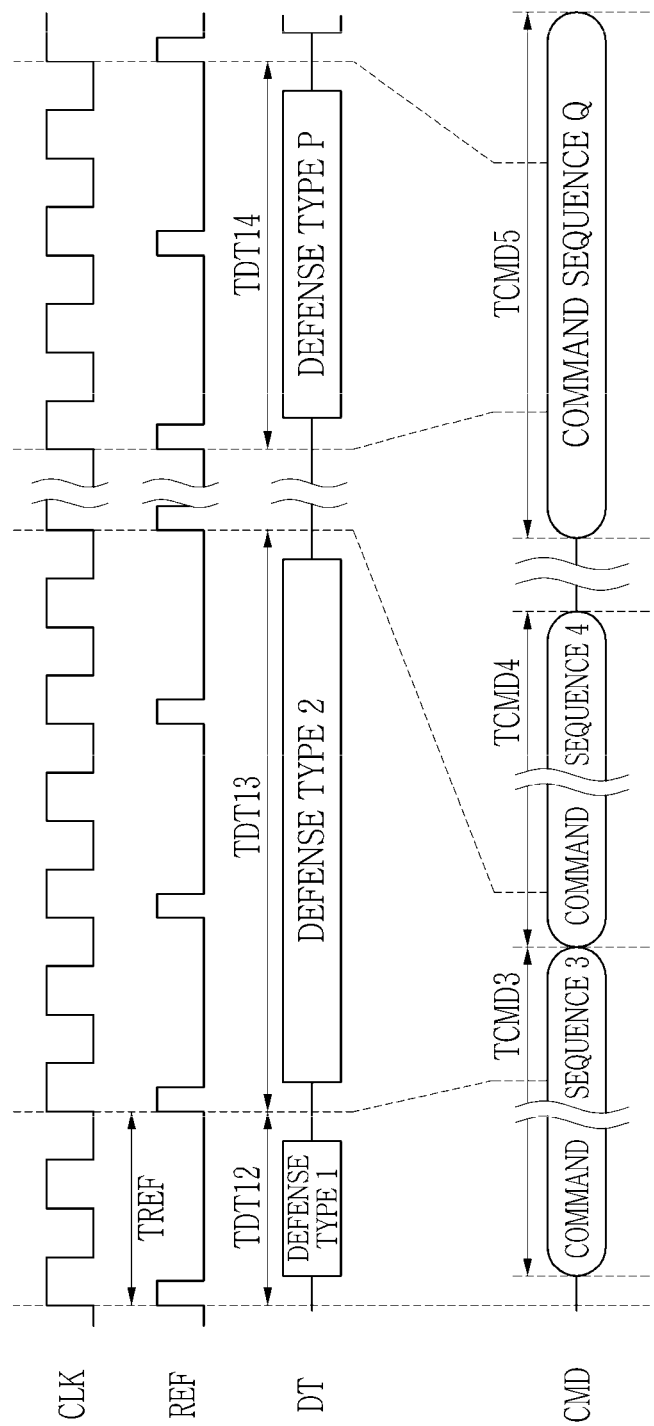
FIG. 8 is a timing diagram for explaining an operation of the memory device according to an embodiment.

FIG. 8 is a timing diagram for explaining an operation of the memory device according to an embodiment.

Referring to FIG. 8, the memory device 200 according to the embodiment may perform refresh in a period TREF. The period TREF may be a period in which the target row refresh (TRR) is performed. The memory device 200 may defend against an attack by combining a plurality of defense types (e.g., first through P-th defense types). Here, P is an integer greater than 2. For example, the memory device 200 may operate as or according to the first defense type during a time interval TDT12, may operate as or according to the second defense type during a time interval TDT13, and may operate as or according to a P-th defense type during a time interval TDT14. Each of the time intervals TDT12 through TDT14 may be an integer multiple of the period TREF. Alternatively, each of the time intervals TDT12 through TDT14 may be an integer multiple of the period of the clock signal CLK. At least one of the time intervals TDT12 through TDT14 may have a different time length. The memory device 200 may operate as or according to the first defense type using a first parameter set, may operate as or according to the second defense type using a second parameter set, and may operate as or according to the P-th defense type using a P-th parameter set. All of the first through P-th parameter sets may be different.

The defense circuit 230 of the memory device 200 may output the refresh address REF_ADDR according to the first defense type in the time interval TDT12, may output the refresh address REF_ADDR according to the second defense type in the time interval TDT13, and may output the refresh address REF_ADDR according to the P-th defense type in the time interval TDT14.

In an embodiment, after the time interval TDT14, the defense circuit 230 may operate from the first defense type as operated in the time intervals TDT12 through TDT14.

In an embodiment, after the time interval TDT14, the defense circuit 230 may recombine the defense types to operate differently from operations in the time intervals TDT12 through TDT14.

The memory device 200 may receive a plurality of commands from the memory controller 100 from an arbitrary time point. The plurality of commands may include third through Q-th commands. A third command sequence may last for a time interval TCMD3, a fourth command sequence may last for a time interval TCMD4, and a Q-th command sequence may last for a time interval TCMD5. The third through Q-th command sequences may be different types of attack commands received from at least one attacker. The first defense type may be a logic for defending against the third command sequence, the second defense type may be a logic for defending against the fourth command sequence, and the P-th defense type may be a logic for defending against the Q-th command sequence. In FIG. 8, each of durations TDT12-TDT14 of the defense types may not exceed each of durations of the command sequences TCMD3-TCMD5.

That is, the defense circuit 230 may determine a change period of the defense type within a range that does not exceed a duration of the shortest attack command sequence expected to be received. In other words, the defense circuit 230 may determine a duration of each defense type so that the defense type is changed while an attack command sequence is received.

In this case, the defense circuit 230 may determine the duration of the defense type in proportion to a duration of the attack for which each defense type is designed or configured to prevent. For example, the defense circuit 230 may determine a duration of the first defense type based on a duration of the third command sequence, may determine a duration of the second defense type based on a duration of the fourth command sequence, and may determine a duration of the P-th defense type based on a duration of the Q-th command sequence. The defense circuit 230 may increase robustness against the attack by switching the defense type.

The conventional memory device might operate in any one of a first defense type, a second defense type, a third defense type, and a fourth defense type. That is, according to an embodiment, the conventional memory device may operate as or according to one defense type in all time intervals without switching the defense type. Thus, a number of points at which the conventional memory device may be attacked when a command sequence attacking the first through fourth defense types is transmitted to the memory device was relatively high.

Meanwhile, the memory device according to the embodiment may operate while switching among a first defense type, a second defense type, a third defense type, and a fourth defense type. That is, according to an embodiment, the memory device may switch defense types at a predetermined period or may determine an operation time of the defense type through a predetermined rule. Thus, a number of points at which the memory device may be attacked when a command sequence attacking the first through fourth defense types is transmitted to the memory device according to the embodiment may decrease. It may be seen that the memory device according to the embodiment defends most attack commands and that the attack command that succeeds in an attack also has a significant reduction in risk score. The risk score is an indicator of defense performance. The lower the risk score, the better the defense performance. In addition, it may be seen that in the memory device according to the embodiment, each defense type generates a synergistic effect to defend even an attack that each defense type may not prevent.

Figure 9:
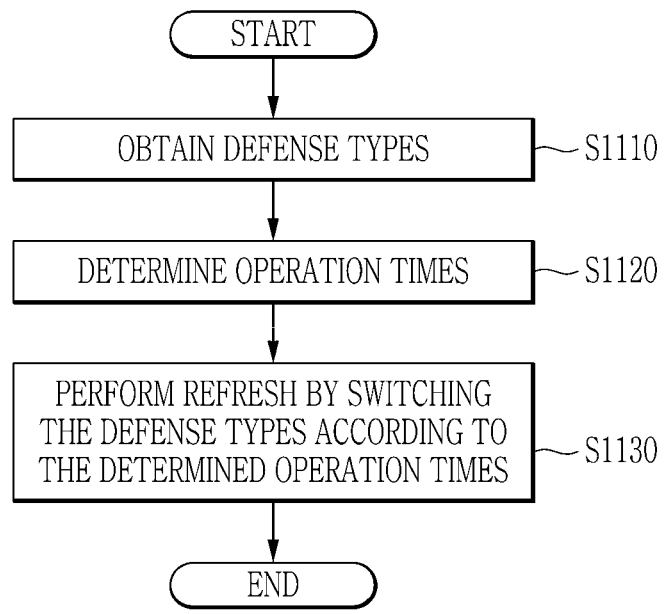
FIG. 9 is a flowchart illustrating a defense method of the memory device according to an embodiment.

FIG. 9 is a flowchart illustrating a defense method of the memory device according to an embodiment.

Referring to FIG. 9, the defense circuit of the memory device may obtain a plurality of defense types (S1110). The defense type may refer to a type of a defense method used to refresh a row (or other memory unit or portion) to be victimized by an attack. The defense type may be a logic for defending against an attack command sequence. For example, a first defense type may be a logic for defending against a first attack command sequence, and a second defense type may be a logic for defending against a second attack command sequence.

When there are at least two defense types for defending against similar attacks, the defense circuit may obtain one of the at least two defense types. The similar attacks may refer to at least two attacks for causing a bit-flip of the same row address in the memory device. For example, the defense circuit may obtain a defense type having the shortest duration among at least two defense types. That is, the defense circuit may use only one defense type among duplicate or similar defense types and may not use the other defense types.

The defense circuit may determine an operation time of each of the plurality of defense types (S1120). In an embodiment, the operation time may be an integer multiple of a refresh period of the memory device. In an embodiment, the operation time may be an integer multiple of a clock signal period of the memory device.

In an embodiment, the operation times of the plurality of defense types may be the same. The defense circuit may determine the operation time based on or based on an expectation as to a duration of the attack command sequence. For example, the defense circuit may determine the operation time to be shorter than the duration of the attack command sequence. In this case, the attack command sequence may be a command sequence having the shortest duration among attack command sequences that the memory device receives.

In an embodiment, the operating times of the plurality of defense types may be different. The defense circuit may determine the operating time based on or based on an expectation as to the duration of the attack command sequence. For example, the defense circuit may determine the operation time of each of the plurality of defense types to be shorter than the duration of the attack command sequence. The defense circuit may determine the operating time in proportion to the duration of the attack command sequence. For example, the defense circuit may determine a duration of the first defense type in proportion to a duration of the first attack command sequence, and may determine a duration of the second defense type in proportion to a duration of the second attack command sequence.

The defense circuit may perform refresh by switching the defense types based on the determined operation time (S1130). The defense circuit may switch the defense types by changing a refresh parameter. The refresh parameter may include whether the address counter is reset in the eviction step, a logic that determines an address to be evicted in the eviction step, a ratio of the general refresh and the target row refresh (TRR), whether the buffer is added to the table of the target row refresh (TRR), whether the pseudo random number is used, or the like.

In an embodiment, the defense circuit may perform refresh by switching the plurality of defense types in order based on the determined operation time in a first time interval and by switching the plurality of defense types in a second time interval subsequent to the first time interval in the same order as an order in the first time interval.

In an embodiment, the defense circuit may perform refresh by switching the plurality of defense types in order based on the determined operation time in the first time interval and by switching the plurality of defense types in the second time interval subsequent to the first time interval in an order different from an order in the first time interval.

Figure 10:
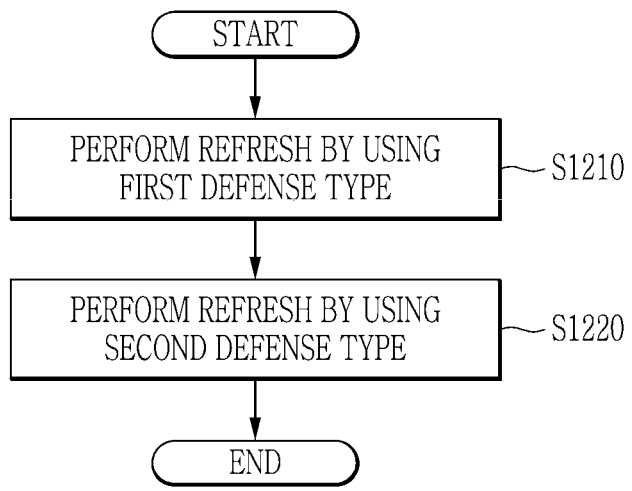
FIG. 10 is a flowchart illustrating a defense method of the memory device according to another embodiment.

FIG. 10 is a flowchart illustrating a defense method of the memory device according to another embodiment.

Referring to FIG. 10, the defense circuit of the memory device may perform refresh using a first defense type for defending against a first attack command sequence (S1210). The first attack command sequence may last for a first duration. The defense circuit may use the first defense type for a third duration that is shorter than the first duration and a second duration of a second attack command sequence.

The defense circuit may perform refresh using a second defense type for defending against a second attack command sequence (S1220). The second attack command sequence may last for the second duration. The defense circuit may use the second defense type for a fourth duration shorter than the first duration and the second duration.

In an embodiment, the third duration and the fourth duration may be the same.

In an embodiment, the third duration and the fourth duration may be different. For example, the defense circuit may determine the third duration in proportion to the first duration, and may determine the fourth duration in proportion to the second duration.

Figure 11:
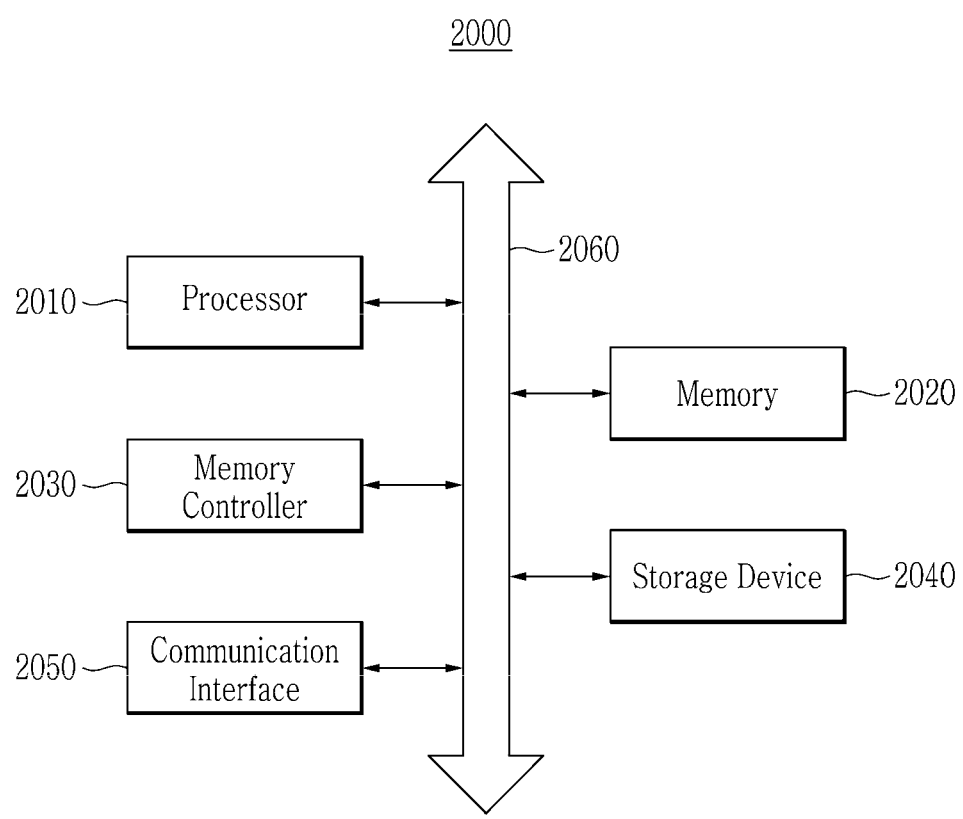
FIG. 11 is a schematic block diagram of a computer system according to an embodiment.

FIG. 11 is a schematic block diagram of a computer system according to an embodiment.

Referring to FIG. 11, the computing system 2000 includes a processor 2010, a memory 2020, a memory controller 2030, a storage device 2040, a communication interface 2050, and a bus 2060. The computing system 2000 may further include a general-purpose component.

The processor 2010 controls an overall operation of each component of the computing system 2000. The processor 2010 may be implemented as at least one of various processing units such as a central processing unit (CPU), an application processor (AP), a graphics processing unit (GPU), and the like.

The memory 2020 stores various types of data and commands. The memory 2020 may be implemented as the memory device described with reference to FIG. 1 through FIG. 10. The memory controller 2030 controls transfer of data or commands to and from the memory 2020. The memory controller 2030 may be implemented as the memory controller described with reference to FIG. 1 through FIG. 8. In some embodiments, the memory controller 2030 may be provided as a chip separate from the processor 2010. In some embodiments, the memory controller 2030 may be provided as an internal configuration of the processor 2010.

The storage device 2040 non-temporarily stores programs and data. In some embodiments, the storage device 2040 may be implemented as a nonvolatile memory. The communication interface 2050 supports wired/wireless Internet communication of the computing system 2000. In addition, the communication interface 2050 may support various communication methods other than Internet communication. The bus 2060 provides a communication function between components of the computing system 2000. The bus 2060 may include at least one type of bus according to a communication protocol between components.

In some embodiments, each component or a combination of two or more components described with reference to FIG. 1 through FIG. 11 may be implemented as a digital circuit, a programmable or non-programmable logic device or array, an application specific integrated circuit (ASIC), or the like.

While this invention has been described in connection with practical embodiments, it is to be understood that the invention is not limited to the disclosed embodiments, but, on the contrary, is intended to cover various modifications and equivalent arrangements included within the scope of the appended claims.

What is claimed is:

1. A defense method of a memory device, the defense method comprising:
executing, by a processor, computer readable program instructions embodied in a non-transitory storage medium to perform operations comprising:
obtaining a plurality of defense types to refresh a row of a memory cell array that is subjected to an attack;
determining respective operation times of the defense types; and
performing a refresh operation for the row of the memory cell array by switching among the defense types based on the respective operation times that were determined.

2. The defense method of claim 1, wherein the respective operation times are an integer multiple of a period of a target row refresh (TRR).

3. The defense method of claim 1, wherein the performing the refresh operation comprises changing a refresh parameter to switch among the defense types, wherein the defense types comprise respective logic configured to defend against respective attack types.

4. The defense method of claim 1, wherein the performing the refresh operation comprises:
switching among the defense types in a first order based on the respective operation times in a first time interval; and
switching among the defense types in the first order in a second time interval following the first time interval.

5. The defense method of claim 1, wherein the performing the refresh operation comprises:
switching among the defense types in a first order based on the respective operation times in a first time interval; and
switching among the defense types in a second order different from the first order in a second time interval following the first time interval.

6. The defense method of claim 1, wherein the respective operation times of the defense types are the same.

7. The defense method of claim 6, wherein the determining of the respective operation times of the defense types comprises determining the respective operation times based on a duration of an attack command sequence.

8. The defense method of claim 7, wherein the determining of the respective operation times based on the duration of the attack command sequence comprises determining the respective operation times to be shorter than the duration of the attack command sequence.

9. The defense method of claim 1, wherein the respective operation times of the defense types are different.

10. The defense method of claim 9, wherein the determining of the respective operation times of the defense types comprises determining the respective operation times based on a duration of an attack command sequence.

11. The defense method of claim 10, wherein the determining of the respective operation times based on the duration of the attack command sequence comprises determining the respective operation times to be shorter than the duration of the attack command sequence.

12. The defense method of claim 10, wherein the determining of the respective operation times based on the duration of the attack command sequence comprises determining the respective operation times to be proportional to the duration of the attack command sequence.

13. The defense method of claim 1, wherein the obtaining the defense types comprises obtaining one of at least two defense types that are configured to defend against a bit flip of a same row address.

14. The defense method of claim 13, wherein the obtaining the one of the at least two defense types comprises obtaining a defense type having a shortest duration among the at least two defense types.

15. A defense method for a memory device, the defense method comprising:
    executing, by a processor, computer readable program instructions embodied in a non-transitory storage medium to perform operations comprising:
    performing a refresh operation for one or more memory cells of the memory device using a first defense type that is configured to defend against a first attack command sequence; and
    performing the refresh operation using a second defense type that is configured to defend against a second attack command sequence that is different than the first attack command sequence.

16. The defense method of claim 15, wherein the first attack command sequence has a first duration,
    wherein the second attack command sequence has a second duration,
    wherein the performing the refresh operation using the first defense type comprises using the first defense type for a third duration that is shorter than the first duration and the second duration, and
    wherein the performing the refresh operation using the second defense type comprises using the second defense type for a fourth duration that is shorter than the first duration and the second duration.

17. The defense method of claim 16, wherein the third duration and the fourth duration are a same duration.

18. The defense method of claim 16, wherein the third duration and the fourth duration are different durations.

19. The defense method of claim 18, wherein the third duration is proportional to the first duration, and wherein the fourth duration is proportional to the second duration.

20. A memory device comprising:
    a memory cell array; and
    a defense circuit coupled to the memory cell array, wherein the defense circuit is configured to obtain a plurality of defense types, determine respective operation times for the defense types, and perform a refresh operation for the memory cell array by switching among the defense types based on the respective operation times that were determined.

\* \* \* \* \*